(12) United States Patent
Wen et al.

(10) Patent No.: US 12,074,406 B2
(45) Date of Patent: Aug. 27, 2024

(54) COHERENT ISING MACHINE BASED ON ON-CHIP OPTICAL MICROCAVITY IN WHISPERING GALLERY MODE

(71) Applicant: BEIJING QBOSON QUANTUM TECHNOLOGY CO., LTD., Beijing (CN)

(72) Inventors: Kai Wen, Beijing (CN); Yin Ma, Beijing (CN)

(73) Assignee: BEIJING QBOSON QUANTUM TECHNOLOG, Beijing (CN)

( * ) Notice: Subject to any disclaimer, the term of this patent is extended or adjusted under 35 U.S.C. 154(b) by 0 days.

(21) Appl. No.: 18/557,083

(22) PCT Filed: Apr. 21, 2022

(86) PCT No.: PCT/CN2022/088132
§ 371 (c)(1),
(2) Date: Nov. 26, 2023

(87) PCT Pub. No.: WO2022/228263
PCT Pub. Date: Nov. 3, 2022

(65) Prior Publication Data
US 2024/0222926 A1  Jul. 4, 2024

(30) Foreign Application Priority Data
Apr. 25, 2021 (CN) .......................... 202110447214.3

(51) Int. Cl.
*H01S 3/00* (2006.01)
*G02F 1/35* (2006.01)
(Continued)

(52) U.S. Cl.
CPC ............ *H01S 3/0092* (2013.01); *G02F 1/353* (2013.01); *G06F 17/11* (2013.01); *H01S 3/0085* (2013.01);
(Continued)

(58) Field of Classification Search
CPC .. H01S 3/0092; H01S 3/0085; H01S 3/06716; H01S 5/1075; G02F 1/353; G06F 17/11
See application file for complete search history.

(56) References Cited

U.S. PATENT DOCUMENTS

| | | | |
|---|---|---|---|
| 2002/0021765 A1* | 2/2002 | Maleki ...................... | G02F 1/17 398/186 |
| 2012/0294319 A1* | 11/2012 | Maleki ...................... | G02F 1/39 372/18 |
| 2014/0321485 A1* | 10/2014 | Seidel ....................... | H01S 5/14 372/19 |

FOREIGN PATENT DOCUMENTS

| | | |
|---|---|---|
| CN | 103457155 A | 12/2013 |
| CN | 103838055 A | 6/2014 |

(Continued)

OTHER PUBLICATIONS

McMahon et al., A Fully Programmable 100-Spin Coherent Ising Machine with All-to-All Connections, Science, Nov. 4, 2016, vol. 354, No. 6312, ISSN: 0036-8075 (Year: 2016).*

(Continued)

*Primary Examiner* — Xinning(Tom) Niu
(74) *Attorney, Agent, or Firm* — Bayramoglu Law Offices LLC

(57) ABSTRACT

A coherent Ising machine based on on-chip whispering gallery mode optical microcavity mainly adopts an optical microcavity integrated with a second laser processing apparatus (a nonlinear crystal), so as to archive an on-chip structure, which, compared with the fiber loop structure in the prior art, has the integration level optimized significantly.

5 Claims, 6 Drawing Sheets

(51) Int. Cl.
*G06F 17/11* (2006.01)
*H01S 3/067* (2006.01)
*H01S 5/10* (2021.01)

(52) U.S. Cl.
CPC ........ *H01S 3/06716* (2013.01); *H01S 5/1075* (2013.01)

(56) References Cited

FOREIGN PATENT DOCUMENTS

| | | | |
|---|---|---|---|
| CN | 105896235 A | 8/2016 | |
| CN | 107508140 A | 12/2017 | |
| CN | 111095303 A | 5/2020 | |
| CN | 112639603 A | 4/2021 | |
| CN | 113178775 A | 7/2021 | |
| JP | 2015163922 A | 9/2015 | |
| JP | 2018147228 A | 9/2018 | |

OTHER PUBLICATIONS

T. Honjo et al. "Long-Term Stable Operation of Coherent Ising Machine for Cloud Service," 2018 Conference on Lasers and Electro-Optics (CLEO), San Jose, CA, USA, 2018, pp. 1-2 (Year: 2018).*

Peter L. McMahon, et al., Supplementary Materials for A fully-programmable 100-spin coherent Ising machine with all-to-all connections, Science, 2016, pp. 1-24.

* cited by examiner

COHERENT ISING MACHINE BASED ON ON-CHIP OPTICAL MICROCAVITY IN WHISPERING GALLERY MODE

CROSS REFERENCE TO THE RELATED APPLICATIONS

This application is the national phase entry of International Application No. PCT/CN2022/088132, filed on Apr. 21, 2022, which is based upon and claims priority to Chinese Patent Application No. 202110447214.3, filed on Apr. 25, 2021, the entire contents of which are incorporated herein by reference.

TECHNICAL FIELD

The invention relates to the field of integration design technologies, in particular to a coherent Ising machine based on on-chip whispering gallery mode optical microcavity.

BACKGROUND

NP complete problems, also known as Non-deterministic Polynomial problems, are one of the Millennium Prize Problems. The so-called NP problems refer to a class of computational problems that can be solved in polynomial time with a certain number of operations.

Based on this, currently in the field of computer science, the NP-complete problem is constrained by computational power and precise results cannot be obtained within effective time. However, algorithms designed using coherent Ising machines can solve problems such as maximum cutting.

However, the existing coherent Ising machines have a low integration level.

SUMMARY

In view of this, to resolve the foregoing problem, the present invention provides a coherent Ising machine based on on-chip whispering gallery mode optical microcavity, and the technical solution is as follows:

A coherent Ising machine based on on-chip whispering gallery mode optical microcavity, and the coherent Ising machine comprises:
 a laser emitter, where the laser emitter is configured to emit a first pulse laser of a first wavelength;
 a first laser processing apparatus, where the first laser processing apparatus is configured to convert the first pulse laser to a second pulse laser with a second wavelength;
 an optical microcavity, where a second laser processing apparatus is integrated in the optical microcavity, and the second laser processing apparatus is configured to convert the second pulse laser injected into the optical microcavity to a third pulse laser with the first wavelength;
 a zero-beat frequency measurement apparatus, where the zero-beat frequency measurement apparatus is configured to obtain a phase of the third pulse laser according to the first pulse laser and the third pulse laser; and
 a feedback apparatus, where the feedback apparatus is configured to adjust an amplitude and phase of the first pulse laser according to the phase of the third pulse laser, and complete injection into the optical microcavity at a preset time point, to enhance the third pulse laser.

Preferably, in said coherent Ising machine, the feedback apparatus comprises an intensity modulator, a phase modulator, and an FPGA apparatus; where,
 the FPGA apparatus is configured to control working statuses of the intensity modulator and the phase modulator according to an output result of the zero-beat frequency measurement apparatus, so as to adjust the amplitude and phase of the first pulse laser;
 The intensity modulator is configured to adjust the amplitude of the first pulse laser; and
 The phase modulator is configured to adjust the phase of the first pulse laser.

Preferably, said coherent Ising machine further comprises:
 a first coupler, where the first coupler is configured to inject the second pulse laser into the optical microcavity.

Preferably, in said coherent Ising machine, an upper waveguide is integrated in the optical microcavity; where
 the first coupler is configured to inject the second pulse laser into the optical microcavity via the upper waveguide.

Preferably, in said coherent Ising machine, the first coupler is also used to inject a first pulse signal processed by the feedback apparatus via the upper waveguide.

Preferably, in said coherent Ising machine, a lower waveguide is integrated in the optical microcavity; where,
 the first pulse signal processed by the feedback apparatus is injected into the optical microcavity via the lower waveguide.

Preferably, said coherent Ising machine further comprises:
 a second coupler, where the second coupler is configured to split the first pulse laser into two pulse lasers; where
 one pulse laser is delivered to the first laser processing apparatus; and the other pulse laser is delivered to the feedback apparatus and the zero-beat frequency measurement apparatus respectively.

Preferably, said coherent Ising machine further comprises:
 an amplifier, where the amplifier is configured to amplify the first pulse laser emitted by the laser emitter.

Preferably, said coherent Ising machine further comprises a third coupler, a photoelectric converter, and an oscillograph; where
 the third coupler is configured to split the third pulse laser output from the optical microcavity into two pulse lasers; where
 one pulse laser is delivered to the zero-beat frequency measurement apparatus; and
 the other pulse laser is delivered to the photoelectric converter;
 the photoelectric converter is configured to complete photoelectric conversion of the pulsed laser;
 the oscillograph is configured to monitor a signal after photoelectric conversion.

Preferably, in said coherent Ising machine, the optical microcavity has a resonant cavity of a rotational symmetrical structure.

Compared with the prior art, the present invention has the following beneficial effects:

The present invention provides a coherent Ising machine based on on-chip whispering gallery mode optical microcavity, comprising a laser emitter, where the laser emitter is configured to emit a first pulse laser of a first wavelength; a first laser processing apparatus, where the first laser processing apparatus is configured to convert the first pulse laser to a second pulse laser with a second wavelength; an optical microcavity, where a second laser processing apparatus is integrated in the optical microcavity, and the second laser processing apparatus is configured to convert the second pulse laser injected into the optical microcavity to a third pulse laser with the first wavelength; a zero-beat frequency measurement apparatus, where the zero-beat frequency measurement apparatus is configured to obtain a phase of the third pulse laser according to the first pulse laser and the third pulse laser; and a feedback apparatus, where the feedback apparatus is configured to adjust an amplitude and phase of the first pulse laser according to the phase of the third pulse laser, and complete injection into the optical microcavity at a preset time point, to enhance the third pulse laser.

The coherent Ising machine mainly adopts an optical microcavity integrated with a second laser processing apparatus (a nonlinear crystal), so as to archive an on-chip structure, which, compared with the fiber loop structure in the prior art, has the integration level optimized significantly.

BRIEF DESCRIPTION OF THE DRAWINGS

To describe the technical solutions in the embodiments of the present invention or in the prior art more clearly, the following briefly describes the accompanying drawings required for describing the embodiments or the prior art. Apparently, the accompanying drawings in the following description show merely the embodiments of the present invention, and persons of ordinary skill in the art may derive other drawings based on the provided accompanying drawings without creative efforts.

DETAILED DESCRIPTION OF THE EMBODIMENTS

The following clearly and completely describes the technical solutions in the embodiments of the present invention with reference to the accompanying drawings in the embodiments of the present invention. Apparently, the described embodiments are only some rather than all of the embodiments of the present invention. All other embodiments obtained by persons of ordinary skill in the art based on the embodiments of present invention without creative efforts shall fall within the protection scope of present invention.

In the inventive process of the present invention, the inventor has discovered that the existing coherent Ising machine uses a fiber loop structure to inject optical pulses into fiber loops for cyclic resonance. During computation, measurement feedback is obtained by outputting pulses, so as to control injection, thus constructing the coherent Ising machine and completing the computation.

In other words, the existing coherent Ising machine utilizes degenerate optical parametric oscillation in nonlinear optics to generate pulses in an optical frequency, injects the pulses into the fiber loops, and then uses a feedback injection mechanism to achieve interactions between the optical pulses, thereby accomplishing computations for problems such as maximum cutting.

However, the inventor has found that this coherent Ising machine has a low system integration level, where, several kilometers of fiber loops need to be integrated and independent nonlinear crystals are used for pumping.

Based on this, the present invention provides a coherent Ising machine based on on-chip whispering gallery mode optical microcavity, greatly improving the integration level of the coherent Ising machine and showing beneficial market effect.

In order to make the foregoing purposes, features, and advantages of the present invention more clearly and easily understood, the present invention is further described below in detail with reference to the accompanying drawings and specific embodiments.

Figure 1:
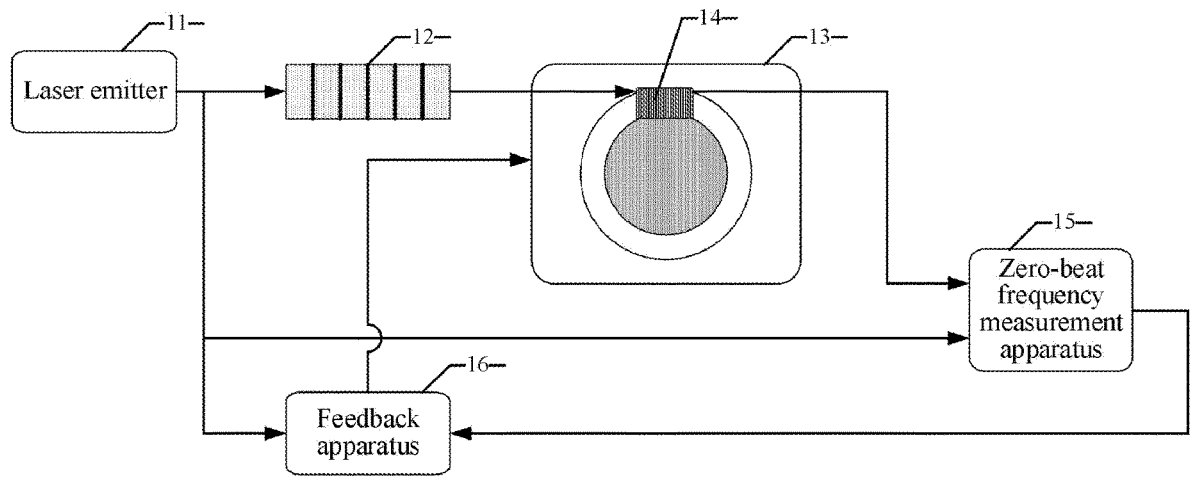
FIG. 1 is the principle and structure schematic diagram of a coherent Ising machine based on on-chip whispering gallery mode optical microcavity according to an embodiment of the present invention.

Referring to FIG. 1, FIG. 1 is the principle and structure schematic diagram of a coherent Ising machine based on on-chip whispering gallery mode optical microcavity according to an embodiment of the present invention.

The coherent Ising machine comprises:
a laser emitter 11, where the laser emitter 11 is configured to emit a first pulse laser with a first wavelength;
a first laser processing apparatus 12, where the first laser processing apparatus 12 is configured to convert the first pulse laser to a second pulse laser with a second wavelength;

an optical microcavity 13, where a second laser processing apparatus 14 is integrated in the optical microcavity 13, and the second laser processing apparatus 14 is configured to convert the second pulse laser injected into the optical microcavity 13 to a third pulse laser with the first wavelength;

a zero-beat frequency measurement apparatus 15, where the zero-beat frequency measurement apparatus 15 is configured to obtain a phase of the third pulse laser according to the first pulse laser and the third pulse laser; and a feedback apparatus 16, where the feedback apparatus 16 is configured to adjust an amplitude and phase of the first pulse laser according to the phase of the third pulse laser, and complete injection into the optical microcavity 13 at a preset time point, to enhance the third pulse laser.

In this embodiment, the optical microcavity 13 is an optical microcavity, in a whispering gallery mode, having a resonant cavity of a rotational symmetrical structure. The optical field can undergo total reflection on the inner surface of the optical microcavity, thus creating a standing wave effect with enhanced resonance.

Optionally, the first laser processing apparatus 12 is a periodically poled lithium niobate (PPLN) crystal, which is a grating structure.

Optionally, the second laser processing apparatus 14 is a periodically poled lithium niobate (PPLN) crystal, which is a grating structure.

The laser emitter 11 is configured to emit a first pulse laser with a first wavelength. For example, the laser emitter 11 is configured to emit the first pulse laser of 1560 nanometers.

The PPLN crystal is pumped with the first pulse laser, and during use of secondary harmonic, a pulse laser with a wavelength of 780 nanometers is generated, that is, a second pulse laser with a second wavelength.

The second pulse laser, coupled and injected into the optical microcavity 13, can induce an optical parametric oscillation process at the PPLN crystal (that is, the second laser processing apparatus 14) at a coupling end of the optical microcavity 13. As a result, a parametric oscillation pulse with a wavelength of 1560 nanometers, that is, a third pulse laser with the first wavelength, is generated.

Where, both 0 or π are taken as the phase of the degeneracy pulse signals.

In this case, the optical pulses circulate in the optical microcavity 13, forming a stable pulse sequence. When a coherent Ising network needs to be constructed, couple the pulses to the detector end of the optical microcavity 13, use the zero-beat frequency measurement apparatus 15 to perform balance zero-frequency measurement, and read the phase information of each pulse. That is, the zero-beat frequency measurement apparatus 15 is used to obtain the phase of the third pulse laser based on the first pulse laser and the third pulse laser.

Besides, feed back the read phase information to a feedback apparatus 16, and the feedback apparatus 16 adjusts the amplitude and phase of the first pulse laser split out based on the phase of the third pulse laser, and injects the first pulse laser into the optical microcavity 13 at a preset time point, so that it can interact with the original third pulse laser to enhance the third pulse laser, thus constructing an optical pulse network with interaction.

It should be noted that the optical pulse network refers to a pulse network of which each of optical pulses generated within a certain time interval serves as a node of the network, and each pulse interacts with others via a feedback injection mechanism thus forming the pulse network. It is a programmable optical pulse network with adjustable pulse timing and controllable network nodes.

Figure 2:
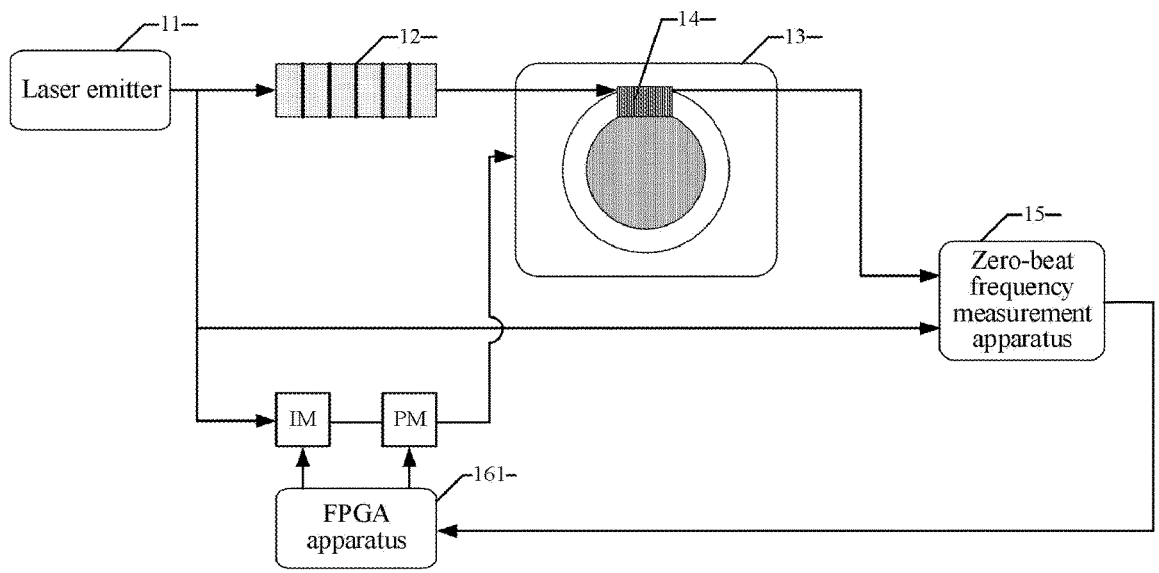
FIG. 2 is the principle and structure schematic diagram of another coherent Ising machine based on an on-chip optical microcavity in a whispering gallery mode according to an embodiment of the present invention.

Optionally, in another embodiment of the present invention, referring to FIG. 2, FIG. 2 is the principle and structure schematic diagram of another coherent Ising machine based on an on-chip optical microcavity in a whispering gallery mode according to an embodiment of the present invention.

The feedback apparatus 16 comprises an intensity modulator (IM), a phase modulator (PM), and a field programmable gate array (FPGA) apparatus 161.

The FPGA apparatus 161 is configured to control operation statuses of the intensity modulator (IM) and the phase modulator (PM) according to an output result of the zero-beat frequency measurement apparatus 15, so as to adjust the amplitude and phase of the first pulse laser.

The intensity modulator (IM) is configured to adjust the amplitude of the first pulse laser.

The phase modulator (PM) is configured to adjust the phase of the first pulse laser.

In this embodiment, a signal receiving end of the FPGA apparatus 161 is configured to receive an output result signal of the zero-beat frequency measurement apparatus 15, that is, the phase information about each pulse read by the zero-beat frequency measurement apparatus 15. A control end of the FPGA apparatus 161 controls both the operation statuses of the intensity modulator (IM) and the phase modulator (PM), modulates the amplitude and phase of each pulse of the first pulse laser split out, and controls and makes sure the modulated pulse is injected into the optical microcavity 13 at a preset time point, so that it can interact with the original third pulse laser to enhance the third pulse laser, thus constructing an optical pulse network with interaction.

Figure 3:
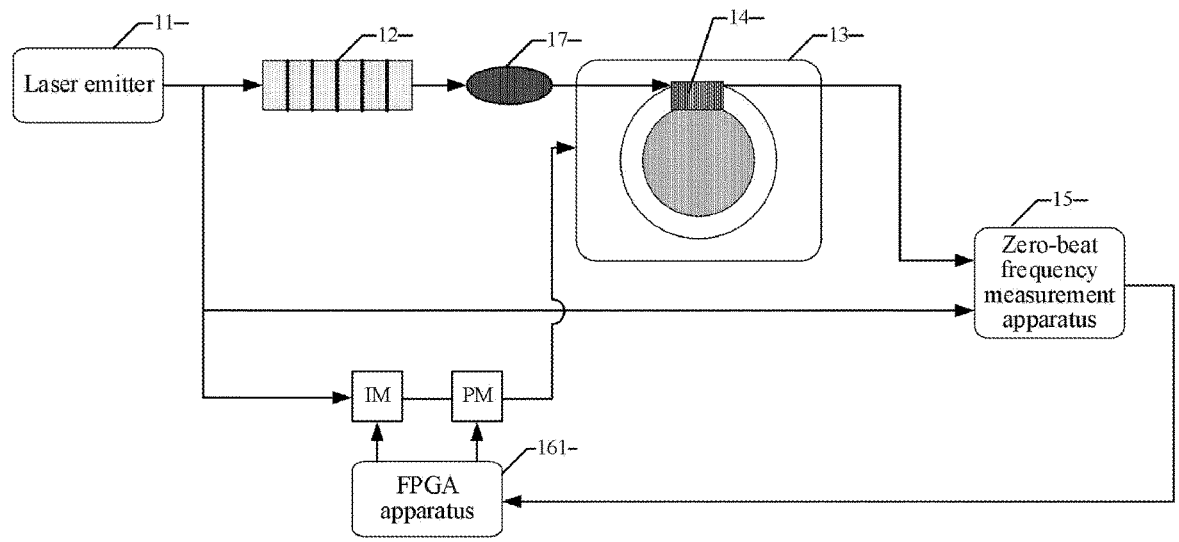
FIG. 3 is the principle and structure schematic diagram of still another coherent Ising machine based on an on-chip optical microcavity in a whispering gallery mode according to an embodiment of the present invention.

Optionally, in another embodiment of the present invention, referring to FIG. 3, FIG. 3 is the principle and structure schematic diagram of still another coherent Ising machine based on an on-chip optical microcavity in a whispering gallery mode according to an embodiment of the present invention.

The coherent Ising machine further comprises:

a first coupler 17, where the first coupler 17 is configured to inject the second pulse laser into the optical microcavity 13.

In this embodiment, the laser emitter 11 is configured to emit a first pulse laser with a first wavelength. For example, the laser emitter 11 is configured to emit the first pulse laser of 1560 nanometers.

The PPLN crystal is pumped with the first pulse laser, and during use of secondary harmonic, a pulse laser with a wavelength of 780 nanometers is generated, that is, a second pulse laser with a second wavelength.

The first coupler 17 couples and injects the second pulse laser into the optical microcavity 13, which can enhance the pulse signal strength of the second pulse laser injected into the optical microcavity 13.

Figure 4:
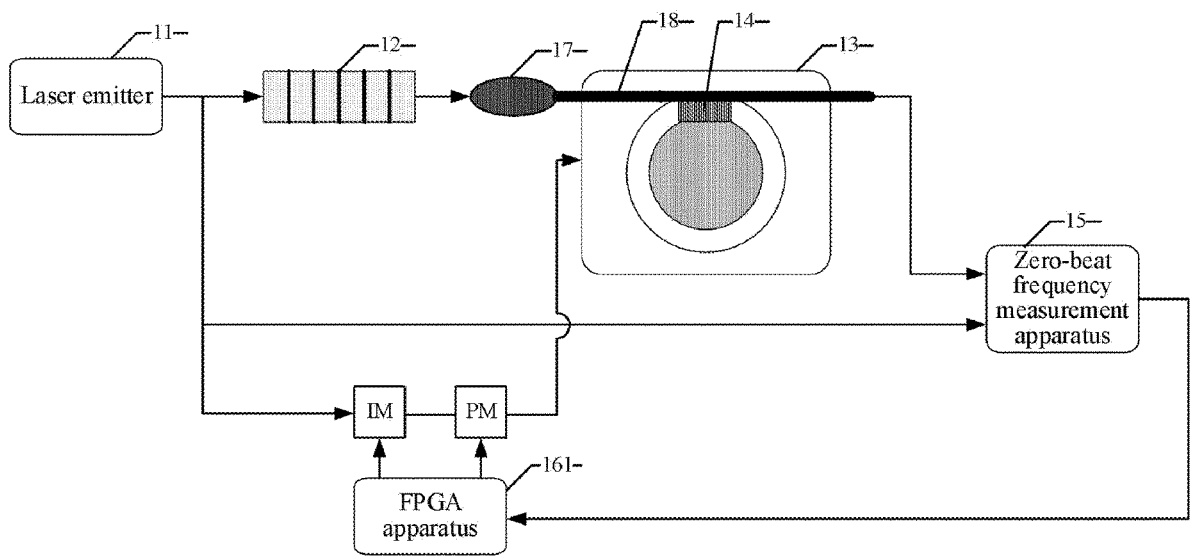
FIG. 4 is the principle and structure schematic diagram of still another coherent Ising machine based on an on-chip optical microcavity in a whispering gallery mode according to an embodiment of the present invention.

Optionally, in another embodiment of the present invention, referring to FIG. 4, FIG. 4 is the principle and structure schematic diagram of still another coherent Ising machine based on an on-chip optical microcavity in a whispering gallery mode according to an embodiment of the present invention.

An upper waveguide 18 is integrated in the optical microcavity 13; where the first coupler 17 is configured to inject the second pulse laser into the optical microcavity 13 via the upper waveguide 18.

In this embodiment, the laser emitter 11 is configured to emit a first pulse laser with a first wavelength. For example, the laser emitter 11 is configured to emit the first pulse laser of 1560 nanometers.

The PPLN crystal is pumped with the first pulse laser, and during use of secondary harmonic, a pulse laser with a wavelength of 780 nanometers is generated, that is, a second pulse laser with a second wavelength.

The first coupler 17 and the upper waveguide 18 couple and inject the second pulse laser into the optical microcavity 13, which can enhance the pulse signal strength of the second pulse laser injected into the optical microcavity 13.

Figure 5:
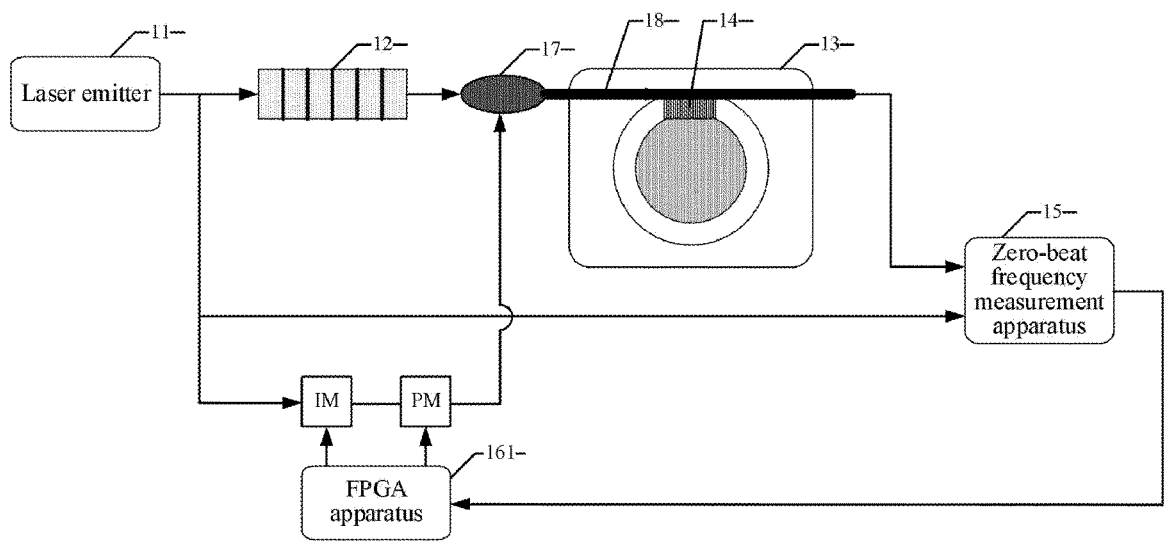
FIG. 5 is the principle and structure schematic diagram of still another coherent Ising machine based on an on-chip optical microcavity in a whispering gallery mode according to an embodiment of the present invention.

Optionally, in another embodiment of the present invention, referring to FIG. 5, FIG. 5 is the principle and structure schematic diagram of still another coherent Ising machine based on an on-chip optical microcavity in a whispering gallery mode according to an embodiment of the present invention.

The first coupler 17 is also used to inject a first pulse signal processed by the feedback apparatus 16 into the optical microcavity 13 via the upper waveguide 18.

In this embodiment, an implementation mode for injecting the modulated first pulse laser into the optical microcavity 13 is provided.

Figure 6:
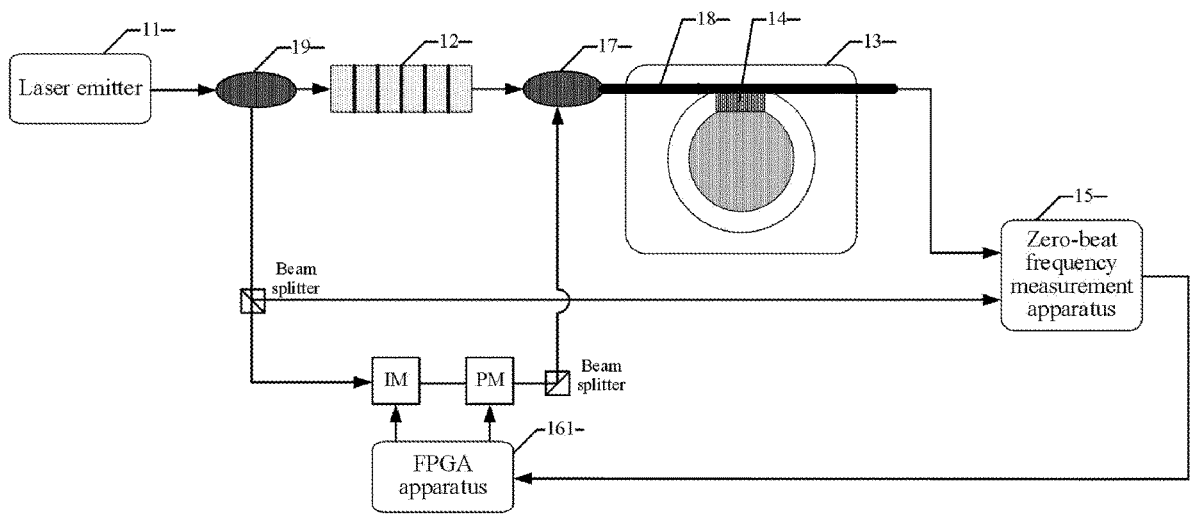
FIG. 6 is the principle and structure schematic diagram of still another coherent Ising machine based on an on-chip optical microcavity in a whispering gallery mode according to an embodiment of the present invention.

Based on the implementation mode, referring to FIG. 6, FIG. 6 is the principle and structure schematic diagram of still another coherent Ising machine based on an on-chip optical microcavity in a whispering gallery mode according to an embodiment of the present invention.

The coherent Ising machine further comprises:
a second coupler 19, where the second coupler 19 is configured to split the first pulse laser into two pulse lasers; where
one pulse laser is delivered to the first laser processing apparatus 12; and the other pulse laser is delivered to the feedback apparatus 16 and the zero-beat frequency measurement apparatus 15 respectively.

In this embodiment, the second coupler 19 is configured to split the laser pulse. One laser pulse is used for pumping the PPLN crystal, and during use of secondary harmonic, a pulse laser with a wavelength of 780 nanometers is generated, that is, a second pulse laser with a second wavelength.

The other pulse laser is, without limitation, delivered through the beam splitter to the feedback apparatus 16 and the zero-beat frequency measurement apparatus 15 respectively.

It should be noted that the pulse laser possessed by the feedback apparatus 16, will be, without limitation, fed back to the first coupler 17 through the splitter.

Figure 7:
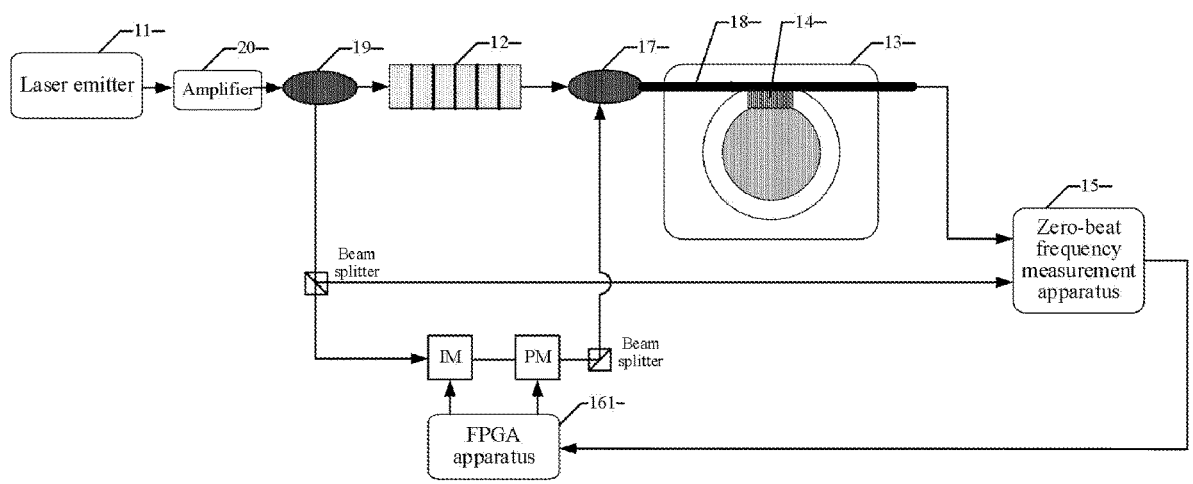
FIG. 7 is the principle and structure schematic diagram of still another coherent Ising machine based on an on-chip optical microcavity in a whispering gallery mode according to an embodiment of the present invention.

Based on the implementation mode, referring to FIG. 7, FIG. 7 is the principle and structure schematic diagram of still another coherent Ising machine based on an on-chip optical microcavity in a whispering gallery mode according to an embodiment of the present invention.

The coherent Ising machine further comprises:
an amplifier 20, where the amplifier 20 is configured to amplify the first pulse laser emitted by the laser emitter 11.

In this embodiment, the amplifier 20 is arranged between the second coupler 19 and the laser emitter 11, and is configured to amplify the first pulse laser emitted by the laser emitter 11.

The amplifier 20 includes but is not limited to an erbium-doped optical fiber amplifier (EDFA), which is an active optical device for signal amplification.

Figure 8:
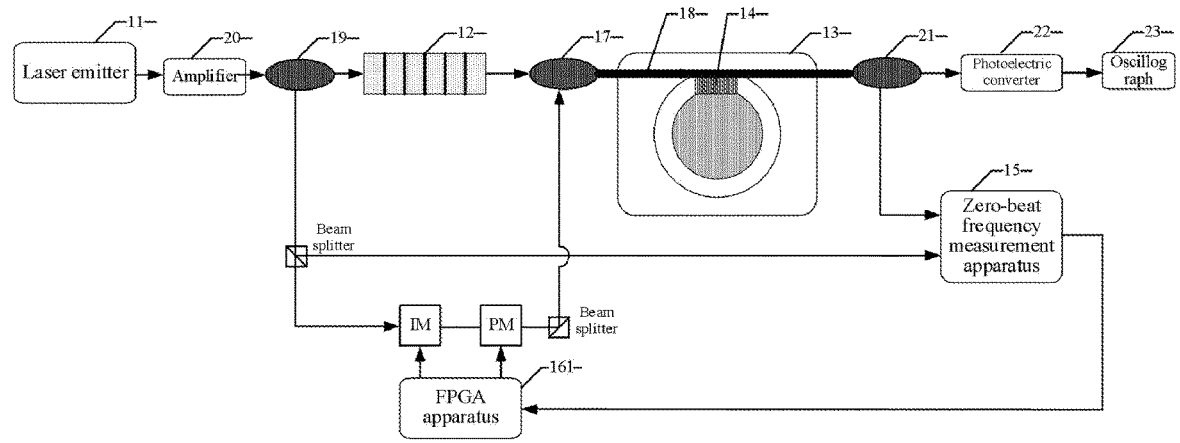
FIG. 8 is the principle and structure schematic diagram of still another coherent Ising machine based on an on-chip optical microcavity in a whispering gallery mode according to an embodiment of the present invention.

Based on the implementation mode, referring to FIG. 8, FIG. 8 is the principle and structure schematic diagram of still another coherent Ising machine based on an on-chip optical microcavity in a whispering gallery mode according to an embodiment of the present invention.

The coherent Ising machine further comprises a third coupler 21, a photoelectric converter 22, and an oscillograph 23; where
the third coupler 21 is configured to split the third pulse laser output from the optical microcavity 13 into two pulse lasers;
one pulse laser is delivered to the zero-beat frequency measurement apparatus 15; and
the other pulse laser is delivered to the photoelectric converter 22;
the photoelectric converter 22 is configured to complete photoelectric conversion of the pulsed laser;
the oscillograph 23 is configured to monitor a signal after photoelectric conversion.

In this embodiment, the optical pulses injected into the optical microcavity 13 circulate in the optical microcavity 13 and form a stable pulse sequence. When a coherent Ising network needs to be constructed, the upper waveguide 18 and the third coupler 21 couple the pulses to the detector end of the optical microcavity 13 for splitting.

One laser pulse is delivered to the zero-beat frequency measurement apparatus 15, then use the zero-beat frequency measurement apparatus 15 to perform balance zero-frequency measurement, and read the phase information of each pulse. That is, the zero-beat frequency measurement apparatus 15 is configured to obtain the phase of the third pulse laser according to the first pulse laser and the third pulse laser.

The other laser pulse is processed by the photoelectric converter 22, and signals are monitored by the oscillograph 23.

Figure 9:
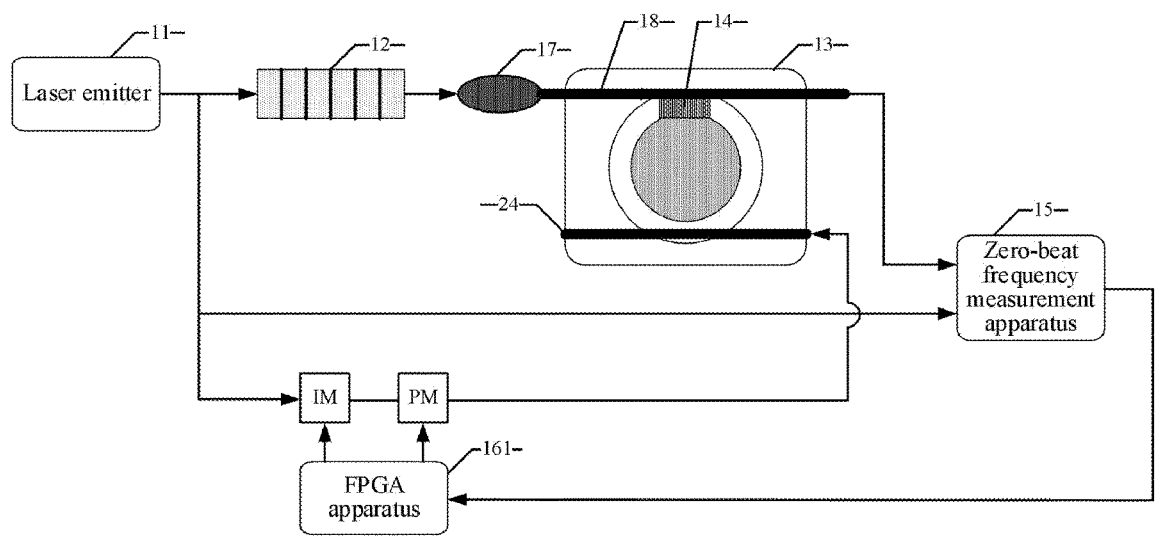
FIG. 9 is the principle and structure schematic diagram of still another coherent Ising machine based on an on-chip optical microcavity in a whispering gallery mode according to an embodiment of the present invention.

Optionally, in another embodiment of the present invention, based on the coherent Ising machine in FIG. 4, referring to FIG. 9, FIG. 9 is the principle and structure schematic diagram of still another coherent Ising machine based on an on-chip optical microcavity in a whispering gallery mode according to an embodiment of the present invention.

A lower waveguide 24 is integrated in the optical microcavity 13; where the first pulse signal processed by the feedback apparatus 16 is injected into the optical microcavity 13 via the lower waveguide 24.

In this embodiment, another implementation mode for injecting the modulated first pulse laser into the optical microcavity 13 is provided.

Figure 10:
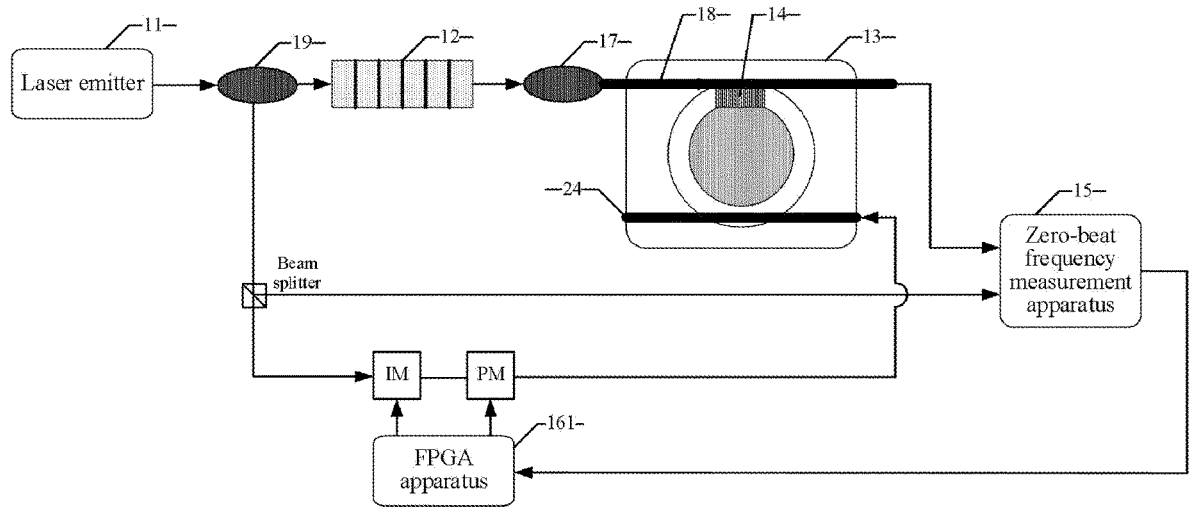
FIG. 10 is the principle and structure schematic diagram of still another coherent Ising machine based on an on-chip optical microcavity in a whispering gallery mode according to an embodiment of the present invention.

Based on the implementation mode, referring to FIG. 10, FIG. 10 is the principle and structure schematic diagram of still another coherent Ising machine based on an on-chip optical microcavity in a whispering gallery mode according to an embodiment of the present invention.

The coherent Ising machine further comprises:
a second coupler 19, where the second coupler 19 is configured to split the first pulse laser into two pulse lasers; where
one pulse laser is delivered to the first laser processing apparatus 12; and the other pulse laser is delivered to the feedback apparatus 16 and the zero-beat frequency measurement apparatus 15 respectively.

In this embodiment, the second coupler 19 is configured to split the laser pulse. One laser pulse is used for pumping the PPLN crystal, and during use of secondary harmonic, a pulse laser with a wavelength of 780 nanometers is generated, that is, a second pulse laser with a second wavelength.

The other pulse laser is, including without limitation, delivered through the beam splitter to the feedback apparatus 16 and the zero-beat frequency measurement apparatus 15 respectively.

Figure 11:
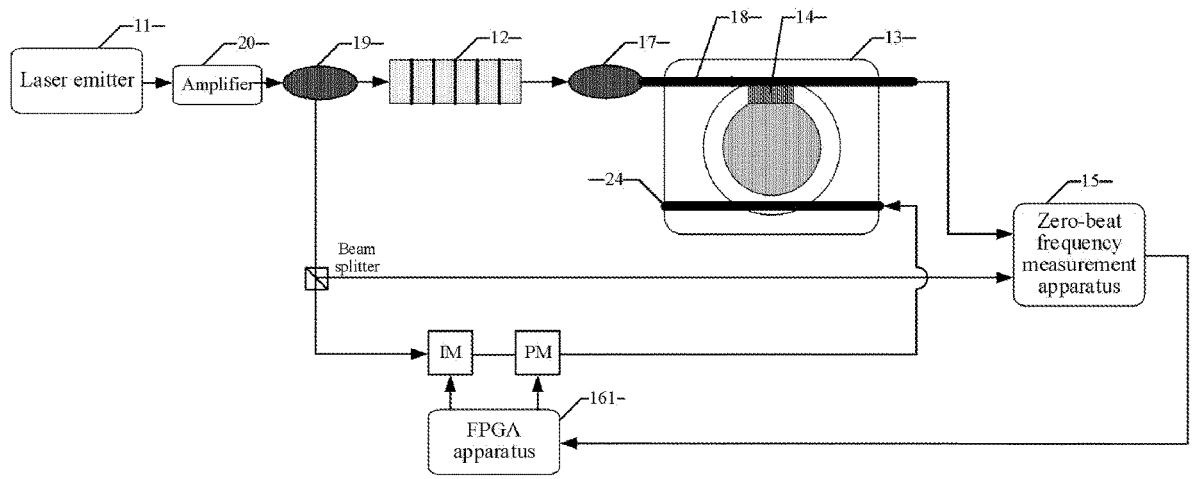
FIG. 11 is the principle and structure schematic diagram of still another coherent Ising machine based on an on-chip optical microcavity in a whispering gallery mode according to an embodiment of the present invention.

Based on the implementation mode, referring to FIG. 11, FIG. 11 is the principle and structure schematic diagram of still another coherent Ising machine based on an on-chip optical microcavity in a whispering gallery mode according to an embodiment of the present invention.

The coherent Ising machine further comprises:
an amplifier 20, where the amplifier 20 is configured to amplify the first pulse laser emitted by the laser emitter 11.

In this embodiment, the amplifier 20 is arranged between the second coupler 19 and the laser emitter 11, and is configured to amplify the first pulse laser emitted by the laser emitter 11.

The amplifier 20 includes but is not limited to an erbium-doped optical fiber amplifier (EDFA), which is an active optical device for signal amplification.

Figure 12:
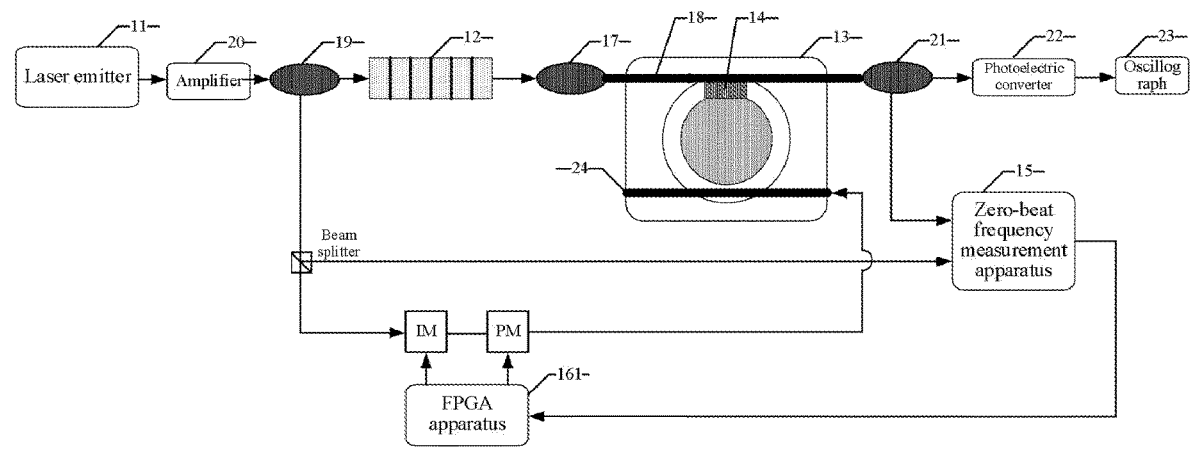
FIG. 12 is the principle and structure schematic diagram of still another coherent Ising machine based on an on-chip optical microcavity in a whispering gallery mode according to an embodiment of the present invention.

Based on the implementation mode, referring to FIG. 12, FIG. 12 is the principle and structure schematic diagram of still another coherent Ising machine based on an on-chip optical microcavity in a whispering gallery mode according to an embodiment of the present invention.

The coherent Ising machine further comprises a third coupler 21, a photoelectric converter 22, and an oscillograph 23; where
the third coupler 21 is configured to split the third pulse laser output from the optical microcavity 13 into two pulse lasers;
one pulse laser is delivered to the zero-beat frequency measurement apparatus 15; and
the other pulse laser is delivered to the photoelectric converter 22;
the photoelectric converter 22 is configured to complete photoelectric conversion of the pulsed laser;
the oscillograph 23 is configured to monitor a signal after photoelectric conversion.

In this embodiment, the optical pulses injected into the optical microcavity 13 circulate in the optical microcavity 13 and form a stable pulse sequence. When a coherent Ising network needs to be constructed, the upper waveguide 18 and the third coupler 21 couple the pulses to the detector end of the optical microcavity 13 for splitting.

One laser pulse is delivered to the zero-beat frequency measurement apparatus 15, then use the zero-beat frequency measurement apparatus 15 to perform balance zero-frequency measurement, and read the phase information of each pulse. That is, the zero-beat frequency measurement apparatus 15 is configured to obtain the phase of the third pulse laser according to the first pulse laser and the third pulse laser.

The other laser pulse is processed by the photoelectric converter 22, and signals are monitored by the oscillograph 23.

It can be known from the foregoing description that for the coherent Ising machine based on an on-chip optical microcavity in a whispering gallery mode provided in the embodiments of the present invention, two nonlinear optical processes can be completed by using the PPLN crystal integrated in the optical microcavity, even when the degeneracy optical parametric oscillation process and the circulating of optical pulses occur simultaneously in the integrated optical microcavity.

In addition, the optical microcavity in the whispering gallery mode is used, which, compared with the fiber loop structure in the prior art, has greatly improved the integration level. Furthermore, non-linear crystals are integrated, so that the whole system is of a chip structure, resolving the problem of chip integration in the CIM system.

The coherent Ising machine based on an on-chip optical microcavity in a whispering gallery mode provided by the present invention is described in detail above. The principle and the implementations of the present invention are described herein using specific examples. The descriptions about the embodiments are merely provided to help understand the method and the core idea of the present invention. In addition, a person of ordinary skill in the art can make changes to the specific implementations and the application scope according to the idea of the present invention. In conclusion, the content of this Description shall not be construed as a limitation to the present invention.

It should be noted that for the purpose of this Description, all embodiments are described in a progressive manner, and the description of each embodiment focuses on differences from one another. For the same or similar content among embodiments, cross-reference can be made. The apparatus embodiment disclosed is essentially corresponding to the method embodiment disclosed, and therefore is described briefly. For related information, refer to descriptions of the method embodiment.

It should be noted that relational terms such as "first" and "second" are only used to distinguish one entity or operation from another entity or operation, and do not necessarily require or imply that there is any such actual relationship or order between these entities or operations. Terms "comprise(s)", "include(s)", or any other variations thereof are intended to cover non-exclusive inclusions, such that a process, method, article or device comprising a series of elements not only comprises said elements, but also comprises other elements which are not expressly listed, or further comprises elements which are inherent to such process, method, article or device. In the absence of more restrictions, the elements defined by the sentence "comprise(s) . . . " do not rule out additional identical elements that may be contained in the process, method, article or device comprising said elements.

The above description of the disclosed embodiments enables a person skilled in the art to implement or use the present invention. Various modifications to these embodiments are apparent to a person skilled in the art, and the general principles defined herein can be realized in other embodiments without departing from the spirit or scope of the present invention. Therefore, the present invention will not be limited to the embodiments shown herein, and shall cover the broadest scope consistent with the principles and novel features disclosed herein.

What is claimed is:

1. A coherent Ising machine based on on-chip whispering gallery mode optical microcavity, wherein the coherent Ising machine comprises: a laser emitter, wherein the laser emitter is used to emit a first pulse laser with a first wavelength; a first laser processing apparatus, wherein the first laser processing apparatus is configured to convert the first pulse laser to a second pulse laser with a second wavelength; an optical microcavity, wherein the optical microcavity has a resonant cavity of a rotational symmetrical structure and is configured to allow an optical field to undergo total reflection on an inner surface of the resonant cavity, a second laser processing apparatus is integrated in the optical microcavity, the second laser processing apparatus is configured to convert the second pulse laser injected into the optical microcavity to a third pulse laser with the first wavelength, and the second laser processing apparatus is integrated at a coupling end of the optical microcavity; a zero-beat frequency measurement apparatus, wherein the zero-beat frequency measurement apparatus is configured to obtain a phase of the third pulse laser according to the first pulse laser and the third pulse laser; and a feedback apparatus, wherein the feedback apparatus is configured to adjust an amplitude and phase of the first pulse laser according to the phase of the third pulse laser, and complete injection into the optical microcavity at a preset time point, to enhance the third pulse laser; and a first coupler, wherein the first coupler is configured to inject the second pulse laser into the optical microcavity via an upper waveguide configured in the optical microcavity; wherein the first coupler is also used to inject a first pulse signal processed by the feedback apparatus into the optical microcavity via the upper waveguide; or, a lower waveguide is configured in the optical microcavity, and the first pulse signal processed by the feedback apparatus is injected into the optical microcavity via the lower waveguide.

2. The coherent Ising machine according to claim 1, wherein the feedback apparatus comprises an intensity modulator, a phase modulator, and a field programmable gate array (FPGA) apparatus; wherein the FPGA apparatus is configured to control working statuses of the intensity modulator and the phase modulator according to an output result of the zero-beat frequency measurement apparatus, so as to adjust the amplitude and phase of the first pulse laser;

the intensity modulator is configured to adjust the amplitude of the first pulse laser; and the phase modulator is configured to adjust the phase of the first pulse laser.

3. The coherent Ising machine according to claim 1, wherein the coherent Ising machine further comprises:

a second coupler, wherein the second coupler is configured to split the first pulse laser into two pulse lasers; wherein one pulse laser is delivered to the first laser processing apparatus; and the other pulse laser is delivered to the feedback apparatus and the zero-beat frequency measurement apparatus respectively.

4. The coherent Ising machine according to claim 1, wherein the coherent Ising machine further comprises:

an amplifier, wherein the amplifier is configured to amplify the first pulse laser emitted by the laser emitter.

5. The coherent Ising machine according to claim 1, wherein the coherent Ising machine further comprises: a third coupler, a photoelectric converter, and an oscillograph;

the third coupler is configured to split the third pulse laser output from the optical microcavity into two pulse lasers; wherein one pulse laser is delivered to the zero-beat frequency measurement apparatus; and the other pulse laser is delivered to the photoelectric converter; the photoelectric converter is configured to complete photoelectric conversion of the pulsed laser; and the oscillograph is configured to monitor a signal after photoelectric conversion.

* * * * *